United States Patent
Schilson et al.

(10) Patent No.: US 7,188,414 B2
(45) Date of Patent: Mar. 13, 2007

(54) METHOD OF ASSEMBLING A FLAT ELECTRICAL CABLE

(75) Inventors: Tom Schilson, Hamilton, IL (US); Steve Kamps, Warsaw, IL (US)

(73) Assignee: Methode Electronics, Inc., Chicago, IL (US)

( * ) Notice: Subject to any disclaimer, the term of this patent is extended or adjusted under 35 U.S.C. 154(b) by 0 days.

(21) Appl. No.: 10/442,294

(22) Filed: May 21, 2003

(65) Prior Publication Data

US 2003/0196828 A1    Oct. 23, 2003

Related U.S. Application Data

(63) Continuation-in-part of application No. 09/454,333, filed on Dec. 3, 1999, now Pat. No. 6,841,735, which is a continuation-in-part of application No. 08/627,136, filed on Apr. 3, 1996, now Pat. No. 6,026,563.

(51) Int. Cl.
*H01R 43/00* (2006.01)

(52) U.S. Cl. .............. 29/868; 29/825; 29/850; 29/872; 156/47; 156/52; 156/73.1; 156/580.2; 228/1.1; 228/110.1

(58) Field of Classification Search .......... 29/868, 29/825, 850, 872, 73.1, 580.2; 156/47, 52, 156/55; 228/1.1, 110.1
See application file for complete search history.

(56) References Cited

U.S. PATENT DOCUMENTS

| | | | |
|---|---|---|---|
| 3,168,617 A | 2/1965 | Richter | 174/117 |
| 3,239,916 A | 3/1966 | Love | 29/155.5 |
| 3,728,183 A | 4/1973 | Wasco et al. | 156/73 |
| 3,775,552 A | 11/1973 | Schumacher | 174/105 |
| 3,829,602 A | 8/1974 | Ishikawa et al. | 174/102 |
| 4,282,940 A * | 8/1981 | Salisbury et al. | 175/11 |
| 4,305,988 A | 12/1981 | Kocher | 428/158 |
| 4,333,978 A * | 6/1982 | Kocher | 428/158 |
| 4,400,227 A | 8/1983 | Riemersma | 156/73.1 |
| 4,427,485 A | 1/1984 | Kutnyak et al. | 156/429 |
| 4,539,442 A | 9/1985 | Puls et al. | 179/115.5 |
| 4,659,872 A | 4/1987 | Dery et al. | 174/117 |

(Continued)

FOREIGN PATENT DOCUMENTS

CA    709373    5/1965

(Continued)

*Primary Examiner*—A. Dexter Tugbang
*Assistant Examiner*—Tim Phan
(74) *Attorney, Agent, or Firm*—Blank Rome LLP

(57) ABSTRACT

A flat electrical cable and a modular rotary anvil for assembling a flat electrical cable wherein the flat cable includes an upper and lower layer. The upper layer has ribs protruding along its length that are substantially parallel to one another, and continuous substantially parallel and adjacent seams formed therebetween. Conductors are placed between the upper and lower layers adjacent the seams. The present invention may have upper and lower polyester layers having copper conductors therebetween and the seams ultrasonically welded in order to provide a flat electrical cable for various applications such as incorporation in an automobile clockspring. The modular rotary anvil includes multiple removable and interchangeable segments or inserts which provide the ability to impart a smooth or knurled textured surface pattern to the work-piece. piece. Other inserts include cutting inserts which provide for a seam on the work-piece while a the same time cuts the work-piece along a seam.

13 Claims, 10 Drawing Sheets

U.S. PATENT DOCUMENTS

| | | | |
|---|---|---|---|
| 4,696,523 A | 9/1987 | Schauer et al. | 439/11 |
| 4,713,132 A * | 12/1987 | Abel et al. | 156/73.1 |
| 4,744,763 A | 5/1988 | Suzuki et al. | 439/15 |
| 4,748,293 A | 5/1988 | Kikuchi et al. | 174/117 |
| 4,767,492 A | 8/1988 | Fukusima et al. | 156/580 |
| 4,975,133 A * | 12/1990 | Gochermann | 156/73.1 |
| 5,069,440 A * | 12/1991 | Lazzarotti et al. | 271/202 |
| 5,134,249 A | 7/1992 | Adachi | 174/92 |
| 5,250,127 A * | 10/1993 | Hara | 156/52 |
| 5,268,179 A | 12/1993 | Rudella | 424/449 |
| 5,475,921 A | 12/1995 | Johnston | 29/878 |
| 5,487,667 A | 1/1996 | Bolen | 439/164 |
| 5,681,409 A | 10/1997 | Lin et al. | 156/73.1 |

FOREIGN PATENT DOCUMENTS

| | | |
|---|---|---|
| JP | 1082694 | 3/1989 |
| JP | 4056011 | 2/1992 |
| JP | 4087219 | 3/1992 |
| JP | 5005932 | 1/1993 |

* cited by examiner

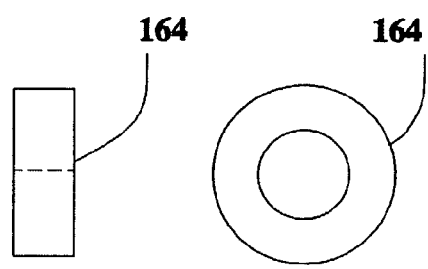
Fig. 10A
Fig. 10B
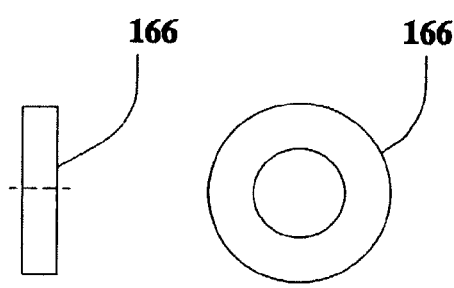
Fig. 11A
Fig. 11B
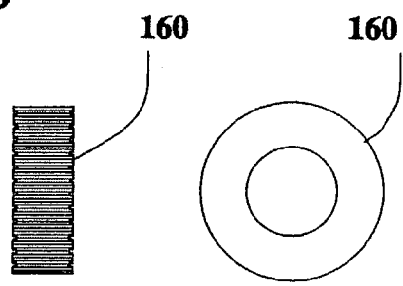
Fig. 12A
Fig. 12B
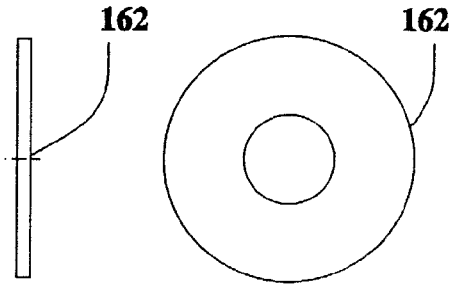
Fig. 13A
Fig. 13B Fig. 18
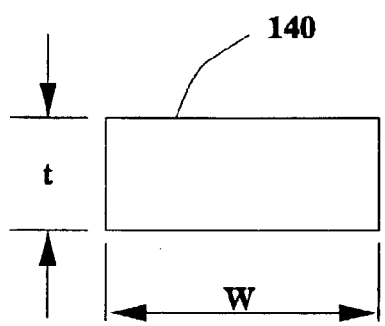
Fig. 19
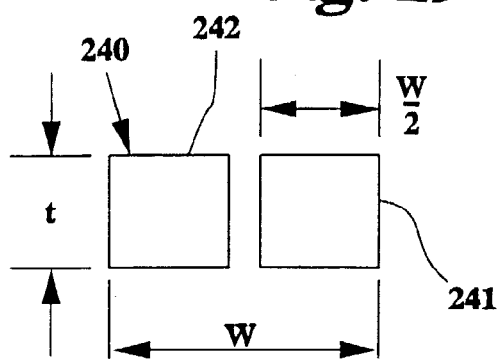
Fig. 20
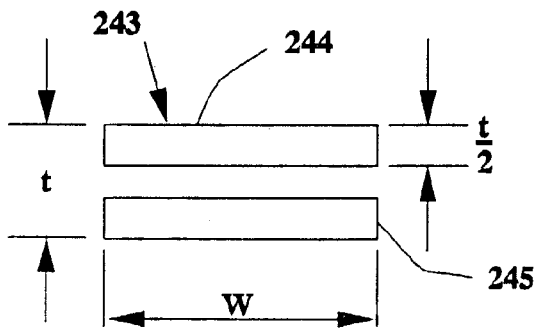
Fig. 21
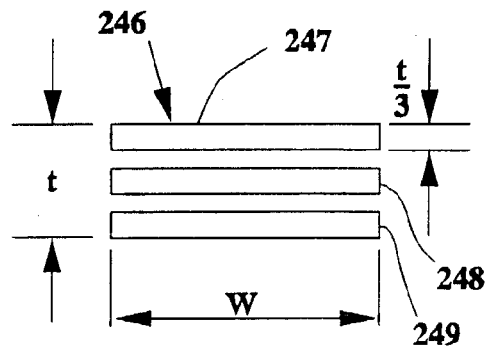
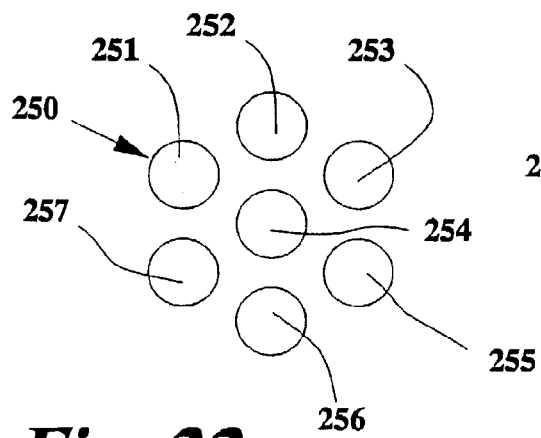
Fig. 22
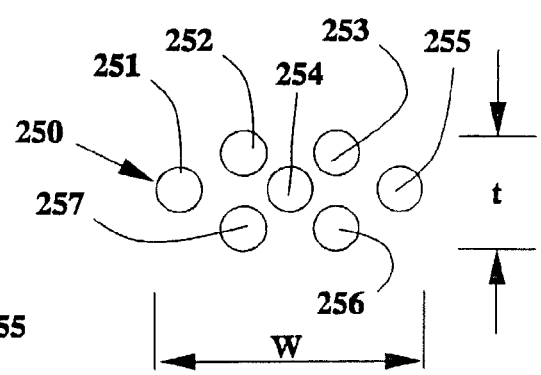
Fig. 23

METHOD OF ASSEMBLING A FLAT ELECTRICAL CABLE

CROSS REFERENCE TO RELATED DOCUMENT

The present application is a division of application Ser. No. 09/454,333, filed Dec. 3, 1999, now U.S. Pat. No. 6,841,735, which is a CIP of application Ser. No. 08/627,136, filed Apr. 3, 1996, now U.S. Pat. No. 6,026,563 the subject matter of each of which is herein incorporated by reference.

BACKGROUND OF THE INVENTION

1. Field of the Invention

The present invention pertains to flat cable and an apparatus for making flat cable. The invention more particularly concerns flat electrical cable with exposed conductors without adhesive residue and a modular rotary anvil which is used to manufacture the flat electrical cable.

2. Discussion of the Background

Flat electrical cables are well known in the art having conductors sandwiched between two insulating layers. Flat conductor cable is known in the art having an upper insulator layer having an adhesive adhered to a first side of the upper layer and a lower layer of insulating material having an adhesive adhered to a first side of the lower layer. A conductor or strands of conductors are placed between the upper and lower insulator layers and all three layers are secured together by the adhesive. However, use of adhesive to bond the layers is disadvantageous in that upon heating of the adhesive, the conductors may float in the free flowing adhesive causing the spacing between the conductors to be inconsistent and non-parallel. Upon drying and attempted attachment of the flat cable to a component, the improperly placed conductor may not align with the conductive leads of the component the cable is to be attached and, thus, the flat cable is unusable and must be discarded. Further, when the cable is stripped to expose the conductors for connection of the cable to a component, the conductors have an adhesive residue thereon which inhibits the conductive properties of the conductor. Also, if any scrap material of the insulator layers is produced, the scrap may not be recycled due to the presence of the adhesive on the insulator layer.

Other bonding techniques are known in the art for bonding multiple layers such as ultrasonic welding. Generally ultrasonic welding has been used for spot welding with thermoplastic materials using either a plunge mode or a shear mode. Therefore, the known methods of welding thermoplastic materials using ultrasonics did not provide for a continuous welded seam where the seam has great pull strength. In the area of electrical cables, seams of great pull strength are required and the previously known welding techniques are not sufficient.

The ultrasonic welding apparatus includes an ultrasonic welding machine 1, as shown in FIGS. 14 and 15. The ultrasonic welding machine 1 includes inner and outer brackets 2 and 3, the anvil frame 4, the horn 5, the pattern roller or rotary anvil 6 mounted to the anvil frame 4, a chain 7 to rotate the rotary anvil 6. However, other methods of rotating the rotary anvil 6 can be used. Socket head cap screws 8 attach the outer bracket 3 to the anvil frame 4. The rotary anvil 6 is mounted in opposition to the horn 5. As shown, in FIGS. 14 and 15, the work-piece (not shown) is fed into and through the gap 9 present between the horn 5 and the rotary anvil 6. As the horn 5 plunges or shears against the work-piece, the rotary anvil 6 remains rigid in the opposing direction of the force and subsequent impacting of the work-piece by the horn 5, thus reacting the forces generated by the process. In this example, as shown in FIGS. 14 and 15, the horn 5 does not rotate. As such, no pattern is formed on the side of the work-piece facing the horn 5, if the surface of the horn is flat and smooth. As the work-piece passes through the gap 9 between the horn 5 and the rotary anvil 6, the rotary anvil 6 rotates. Thus, a pattern can be imprinted on the surface of the work-piece. Such a method of manufacture requires that a unique anvil be created and inventoried for every type of and size of pattern desired to be formed on the work-piece.

SUMMARY OF THE INVENTION

Therefore, it is an object of the present invention to provide a flat electrical cable which is bonded without use of adhesives and provides for a continuous seam.

It is another object of the invention to provide a flat electrical cable that is light in weight.

It is still another object of the invention to provide a flat electrical cable that has a high natural frequency.

It is a further object of the invention to reduce the number of tools required to be kept in inventory for producing the flat electrical cable.

It is another object of the invention to increase the variety of tool sets being run at the same time.

It is an additional object of the invention to support flexible manufacturing of flat electrical cable.

It is another object of the invention to provide a method of assembling a flat cable by bonding without using adhesives and to provide the capability of forming a continuous seam and other types of seams.

It is a further object of the present invention to provide a flat cable having exposed conductors without an adhesive residue.

It is another object of the present invention to provide a flat electrical cable which operates quietly during use in a clockspring.

It is a further object of the invention to provide a durable flat electrical cable.

It is still another object of the invention to provide a flat electrical cable which carries a large amount of current for a long period of time.

It is still a further object of the invention to provide a flat electrical cable which conveys many functions such as pulse heating to a steering wheel.

It is still another object of the invention to provide a flat cable having multiple types of conductors, conductor groups, or optical fibers.

It is yet another object of the invention to provide for a low cost flat electrical cable.

A principal object of this invention is to provide a flat electrical cable comprising an upper insulator layer, a lower insulator layer connected to the upper layer, a lower insulator layer connected to the upper layer along substantially continuous parallel spaced-apart seams and an intermediate layer comprised of individual strands of conductors which lie adjacent and substantially parallel to the seams and the conductors do not have an adhesive residue thereon. The upper layer may include a plurality of raised surfaces running parallel to each other along the length of the flat cable. The lower layer may be substantially planar and include a pattern formed on the majority of the surface of the lower layer. Seams positioned between adjacent conductors have a textured surface pattern, and seams positioned along edges of the flat electrical cable have a substantially smooth surface pattern. The upper and lower insulator layers may be polyester. The conductors may be copper. The seams may be ultrasonically welded. The conductors may be exposed at an end portion of the flat cable beyond the upper and lower insulator layers. The cable may include a continuous seam except for a nonbonded area where the upper and lower insulator layers are not connected. The cable may include a continuous seam except for a nonbonded area where the upper and lower insulator layers include windows that expose the conductors.

In still another embodiment of the invention, a flat cable is provided comprising an upper insulator layer, a lower insulator layer, and an intermediate layer. The lower insulator layer connected to the upper insulator layer along substantially continuous parallel spaced apart seams. The intermediate layer comprised of conductor groups which lie adjacent and substantially parallel to the seams. Furthermore, the conductor groups do not have an adhesive residue on their outer surface.

In another embodiment of the invention, a flat electrical cable is provided comprising an upper layer of polyester having a ribbed surface, a lower layer of polyester connected to the upper layer along substantially continuous parallel spaced-apart ultrasonically bonded seams and individual strands of copper conductors lying substantially parallel and adjacent to the seams between the upper and lower layers. The lower layer may have a pattern along the majority of its exposed surface. Seams positioned between adjacent conductors have a textured surface pattern, and seams positioned along edges of the flat electrical cable have a substantially smooth surface pattern.

In another embodiment of the invention, a clockspring is provided for electrically connecting an airbag in a steering wheel of a vehicle through a steering column to crash sensors, the clockspring comprising a housing having an inner chamber and a flat electrical cable including an upper insulator layer, a lower insulator layer connected to the upper layer along substantially continuous parallel spaced-apart seams and an intermediate layer comprised of individual strands of conductors which lie adjacent and substantially parallel to the seams and the conductors do not have an adhesive residue thereon, the flat electrical cable being mounted in the chamber of the clockspring. Seams positioned between adjacent conductors have a textured surface pattern, and seams positioned along edges of the flat electrical cable may have a substantially smooth surface pattern.

In a further embodiment of the invention, a modular rotary anvil for an ultrasonic welding machine is provided comprising a first end segment, a second end segment, and a at least one insert having a first side and a second side, each of the first side and the second side configured to attach to at least one of other inserts, the first end segment, and the second end segment. The first end segment and the second end segment configured to attach to the ultrasonic welding machine.

In another embodiment the invention takes the form of a method of assembling a flat electrical cable. The steps of producing the flat electrical cable include simultaneously feeding an upper and lower layer of insulating material and an intermediate layer of conductors between a horn and a modular rotary anvil, and the next step being ultrasonically bonding the upper and lower layers together along a seam substantially adjacent the conductors.

In still yet another embodiment the invention takes the form of a method of assembling a clockspring. The steps of producing the clockspring include inserting a flat cable into a clockspring housing, where the flat cable is made pursuant to the method steps recited in the paragraph above.

These and other features of the invention are set forth below in the following detailed description of the presently preferred embodiments.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 10A and 10B are a side view and a front view of a large bracket insert from FIG. 8A;

FIGS. 11A and 11B are a side view and a front view of a small bracket insert from FIG. 8A;

FIGS. 12A and 12B are a side view and a front view of one knurled insert from FIG. 8A;

FIGS. 13A and 13B are a side view and a front view of one smooth seam insert from FIG. 8A;

FIG. 18 is an end view of a single conductor;

FIG. 19 is an end view of dual or tandem conductors;

FIG. 20 is an end view of dual stacked conductors;

FIG. 21 is an end view of tripled stacked conductors;

FIG. 22 is an end view of a wire rope conductor;

FIG. 23 is an end view of a compressed wire rope conductor;

DESCRIPTION OF THE PREFERRED EMBODIMENTS

Figure 1:
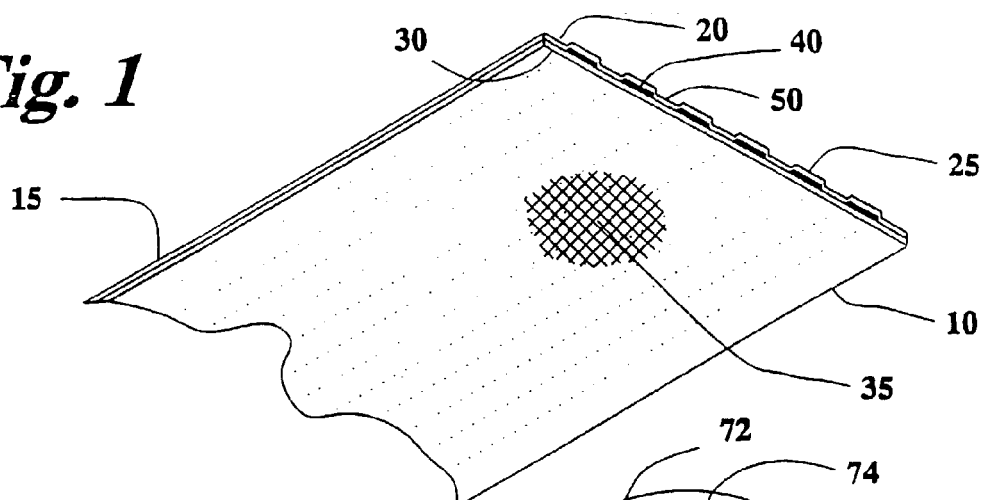
FIG. 1 is a perspective view of the flat cable of the present invention.

Referring now to the drawings, wherein like reference numerals designate identical or corresponding parts throughout the several views, and more particularly to FIG. 1 thereof which shows a finished flat conductor cable 10 of a preferred embodiment of the present invention. The flat cable 10 has an upper layer 20 and a lower layer 30 formed of an insulating material. In a preferred embodiment, polyester insulator is used, such as that having a thickness of 0.001 inches. However, thicker insulator materials may be used to provide stronger bonds, such as where the seams are narrow. Intermediate the upper and lower layers 20, 30 are conductors 40. The conductors 40 are made of individual strands of metallic material which lie substantially parallel to one and another along the length of the cable 10. In a preferred embodiment, the conductors are formed of annealed copper having a dead soft hardness rating. However, any other conductor may be used such as copper clad steel. Furthermore, the conductor can be replaced with a fiber optic cable. The conductors 40 are separated by seams 50. The seams 50 are formed by the continuous bonding between the upper layer 20 and the lower insulator layer 30. A plurality of parallel spaced-apart seams 50 run continuously along the length of the cable 10. In a preferred embodiment, the spacing between the plurality of conductors 40 comprises the seams 50. In other words, the width of each seam 50 approximately equals the space between the adjacent conductors 40. In such a construction, the conductors 40 are trapped in a pocket or encapsulated between the seams 50 and the upper and lower insulator layers 20, 30 to avoid any shorting between the parallel strands of conductors 40. In a preferred embodiment, the seams 50 are ultrasonically bonded, which will be discussed further below.

The cable 10 includes a raised surface 25 or ribs above the conductors 40 on the upper layer 20 of the insulator. The raised surface 25 provides for a ribbed texture along the upper surface 20 of the cable 10 and reduces the surface area of the upper layer 20 so that less friction is created when the upper layer 20 rubs against another surface. In an embodiment where the flat cable 10 is wound in a spool, the noise of the surface of the upper layer 20 of the flat cable 10 rubbing against the lower layer 30 will be reduced due to the ribs 25. In addition, in another embodiment, the lower layer 30 of the flat cable 10 has a pattern 35 adhered thereto. The pattern 35 acts to reduce the surface area of the most extraneous portions of the lower layer 30 in order to further reduce friction and noise of the lower layer 30 rubbing against another surface.

In the preferred method of assembling the flat cable 10, the bonding of the upper and lower layers 20, 30 occurs only at the plurality of seams 50 and no bonding of the upper layer 20 or lower layer 30 occurs to the conductors 40. In such an arrangement, the conductors 40 are bounded on each side by the seams 50 but are loose in the compartment formed by the upper and lower layers 20, 30 which are not bonded in the area along the length of the conductor 40. This arrangement provides an advantage in that when the end of the cable 10 is stripped and the conductors 40 are exposed, the exposure operation is simplified in that there is no bonding between the conductors 40 and the upper or lower layers 20, 30. Therefore, there is no residue on the conductors 40 and cleaning of the conductors is not required in order to provide the desired level of conductivity. An edge 15 of the flat cable 10 is also bonded and has a continuous seam such as provided by an ultrasonic weld. This edge 15 may be provided by cutting the flat cable 10 via slitting station 89 shown in FIG. 4. The edge 15 produced by cutting is a smooth edge or surface. The smooth surface of the edge 15 results in a flat electrical cable which provides for quiet operation during use in a clockspring, even though the edge 15 contacts sound damping material of the clockspring housing.

In the preferred embodiment, the seam 50 is continuous and runs along the entire length of the cable 10. The preferred use of the flat electrical cable 10 of the present invention is in an automobile clockspring which provides for the electrical connection of the airbag of an automobile steering wheel through the steering column to stationary crash sensors in the automobile. In such clocksprings, the flat ribbon cable is wound around an inner chamber of the clockspring housing and generally has a length of approximately two feet. In the process described below, the flat cable is formed continuously in spools of over one-thousand feet or any desired length. The spool of cable is later cut to two feet lengths and the ends of the two feet lengths are stripped. In the preferred embodiment of the invention, the overall length of the seams will be equal to the length of the entire spool of cable, as the seams 50 are continuous.

In an alternate embodiment, the seam may be noncontinuous at the separation areas of the cable 10. Thus, the majority of the length of the cable 10 has a continuous seam 50 except at the end of that portion of the cable having a desired length to be used and attached to a component. For example, at two feet intervals along the length of the cable 10 a narrow nonbonded separation area may be formed. The nonbonded areas are located at the point along the cable where it is intended that the flat cable will be cut or separated. A nonbonded area will be formed every two feet of the cable so that the end portions of the two foot lengths of the flat cable 10 will have small areas, for example, one inch lengths, which are nonbonded. In this way, the ends of the cable may be easily processed in order to expose the conductors 50. Having the nonbonded areas allows for the top and bottom layers to easily be clipped or cut to expose the conductors 40. In the previously mentioned embodiment having completely continuous seams, the desired lengths of the flat cable must be inserted in a grinding or buffing machine in order to remove the layers of insulation and expose the conductors or cut the insulator layers from between the conductors. The method of forming the nonbonded areas at specific intervals along cable will be discussed further below.

An alternate embodiment of the present invention may be provided having multiple layers of insulating material and conductors therebetween. Additional layers may include ground wires or a ground plane or a drain wire or additional layers to limit cross talk.

Figure 2:
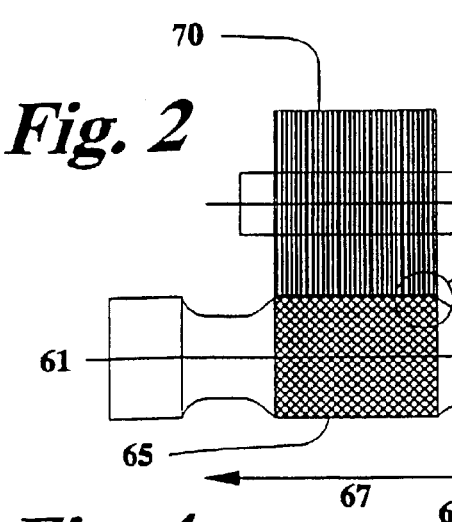
FIG. 2 is a side-elevation view of the preferred apparatus for bonding of the flat cable.

The method of assembling the flat cable of the present invention is best understood with reference to FIGS. 2–7. One specific bonding process will be discussed with reference to FIGS. 2, 3 and 6 and the overall process with reference to FIG. 4. Turning to FIG. 2, a rotary horn 60 is shown having weld surface 65. Adjacent the rotary horn 60 is rotary anvil 70. The rotary anvil 70 rotates about axis 71 and rotary horn 60 rotates about axis 61. The rotary horn 60 provides for the ultrasonic bonding of the flat cable which is inserted between the rotary horn 60 and the rotary anvil 70. In a preferred embodiment, a full wave rotating horn of titanium is used in order to provide for a weld surface 65 of greater than one inch. In a preferred embodiment, the weld surface 65 is three inches wide. The three inch wide weld surface 65 is preferred so that the maximum footage of flat cable 10 may be produced. Although in the preferred embodiment of the end use of the cable 10 widths are approximately one-half inch, the three inches wide weld surface 65 allows for the simultaneous assembly of six cables side-by-side, to be separated later. The three inch weld surface 65 provides for the maximum width without sacrificing a uniform amplitude level of the rotary horn 60 so that the ultrasonic bond strength is maintained. In one embodiment, the full wave horn 60 provides for ultrasonic bonding via a shear mode or in the horizontal direction of arrow 67. The use of the full wave horn having a shear mode provides for continuous welding to form a continuous seam 50 of the flat cable 10. As is known in the ultrasonic bonding art, the rotary horn 60 is attached to a converter and a booster which generates a voltage which creates a wave which passes through the rotary horn 60 and causes the rotary horn 60 to oscillate or vibrate in the direction of arrow 67. In one embodiment, the horn will vibrate at approximately 20 kHz. However, the horn can be vibrated at frequencies in the range of 30 or 40 kHz. Furthermore, the rotary horn 60 can be vibrated in the plunge mode, as is described below.

Figure 3:
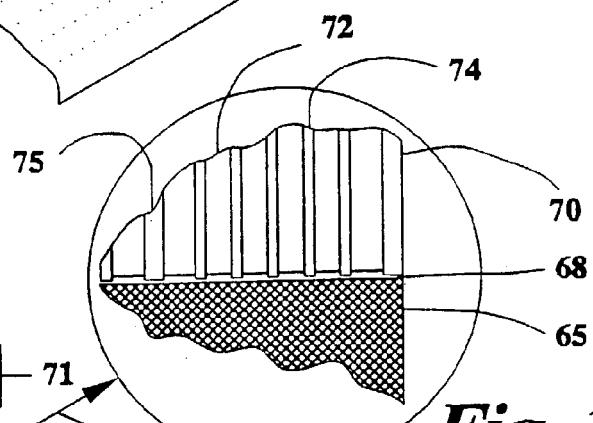
FIG. 3 is an enlarged view of the bonding area of FIG. 2.
Figure 6:
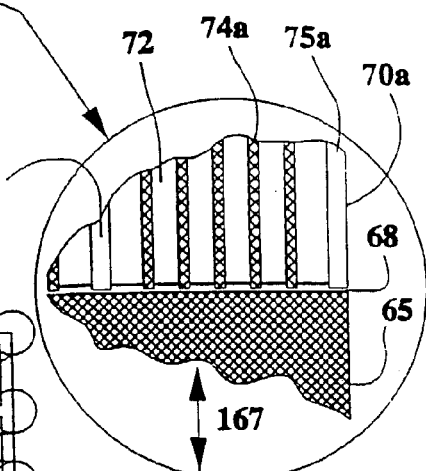
FIG. 6 is an enlarged view of the bonding area of FIG. 2 where a modular rotary anvil is shown being used with a horn moving in a plunging action.

Turning to FIG. 3, an enlarged view of the FIG. 2 shows the bonding area between the weld surface 65 of the rotary horn 60 and the rotary anvil 70. The rotary anvil 70 includes a plurality of copper locating grooves 72 and interspersed between the grooves 72 are protrusions 74. The flat cable is fed between the weld surface 65 of the rotary horn 60 and the rotary anvil 70 at gap 68 so that the upper insulator layer 20 is adjacent the rotary anvil 70 and the lower layer 30 is adjacent the rotary horn 60. The grooves 72 and protrusions 74 of the rotary anvil 70 are designed and oriented according to the specific arrangement and spacing of conductors desired in the flat cable. In the embodiment shown in FIG. 3, the rotary anvil 70 has been designed to form a flat cable having six conductors as can be seen by the group of six grooves 72. The rotary horn 70 is designed so that a batch of flat cables are formed simultaneously side-by-side which may be separated later during the assembly process. The broad protrusion 75 provides for a broad space in order to allow for the separation of individual flat cables. In a preferred embodiment, the anvil and weld surface 65 of the rotary horn 60 are designed to make six individual cables simultaneously side-by-side, each having six conductors. In the present embodiment, the entire bonding surface between the weld surface 65 of the rotary horn and the rotary anvil 70 is three inches wide. Each individual flat cable is approximately half of an inch wide and therefore, six individual cables can be formed simultaneously and later split in order to form the individual flat cables. Therefore, in the preferred embodiment, the rotary anvil 70 will have five wide protrusion areas 75 in order to form six separate areas having six grooves 72 to form each individual flat cable having six conductors therein. The grooves 72 have a width just slightly larger than the width of the conductors being bonded within the flat cable. In the preferred embodiment, the width of the grooves 72 is 0.045 inches. The spacing of the conductors is determined by the width of the protrusion 74. In the preferred embodiment, the protrusions 74 all have the same width of approximately 0.0338 inches. However, all these dimensions may vary dependent on the overall design and requirements of cable desired. In an embodiment, the rotary anvil 70 may be interchangeable with other rotary anvils having different spacing of the grooves 72 and protrusions 74 to assemble a flat cable having differently spaced conductors. In a preferred embodiment, as discussed below, the rotary anvil 70 takes the form of a modular rotary anvil 70a as shown in FIG. 6, where multiple rotary anvils 70 are not required to be on hand to produce flat cable having different spacing of the grooves.

The upper and lower insulator layers having conductors arranged in between and spaced corresponding to the spacing of the protrusions 74 of the rotary anvil 70 are fed between the rotary anvil 70 and the rotary horn 60 where bonding of the assembly will occur. The height of the gap 68 between the protrusions 74 and the weld surface 65 is slightly less than the combined height of the two layers of the insulator. Therefore, upon insertion of the upper and lower insulator layers between the weld surface 65 of the rotary horn and the rotary anvil 70, the insulator layers are compressed between the protrusions 74 and the weld surface 65. The conductors 40 of the flat cable 10 are spaced correspondingly to the grooves 72. The conductors 40 fill the space in each groove 72 above the weld surface 65. The grooves 72 have a predetermined depth in order to avoid the welding of the conductors to the upper and lower insulator layers 20, 30. As the depth of the grooves 72 increases, the amount of tension placed on the lower layer 30 of the flat cable against the weld surface 65 is reduced so that welding does not occur between the conductor and the insulator layers 20, 30. In a preferred embodiment, the grooves 72 have a depth of 0.004 inches.

In one embodiment, the insulator layers 20, 30 and conductors 40 are fed through the gap 68 at a speed of approximately 4 inches per second. The vibrating rotary horn 60 creates a frictional heat at the weld surface 65. Bonding occurs at the points where the protrusions 74 compress the insulator layers against the active weld surface 65. The compressive force between the protrusion 74 and the weld surface 65 cause the bonding between the upper and lower insulator layers to occur only at this interface. The protrusions 74 also provide for the shape of upper insulation layer 20 of the flat cable 10. The grooves 72 form the raised area 25 of the flat cable 10 and the protrusions 74 form the depressed seams 50. Further the weld surface 65 of the rotary horn 60 includes a pattern which is burned into the lower layer 30 of the insulator. In one embodiment, the pattern on the weld surface 65 is 90° knurl.

It can thus be understood that there is no bond between the upper and lower insulators at the groove area 72 in which the conductor is located. Therefore, upon the process of exposing the conductors in order to provide for attachment of the flat cable 10 to a component, the conductors 40 may be easily exposed because there is no insulator material adhered to the conductors 40. Further, it can be understood that the present invention overcomes the prior art in that there is no adhesive bonded to the conductors in that the bonding of the present invention only occurs at the predetermined areas where the protrusions 74 are located.

Figure 4:
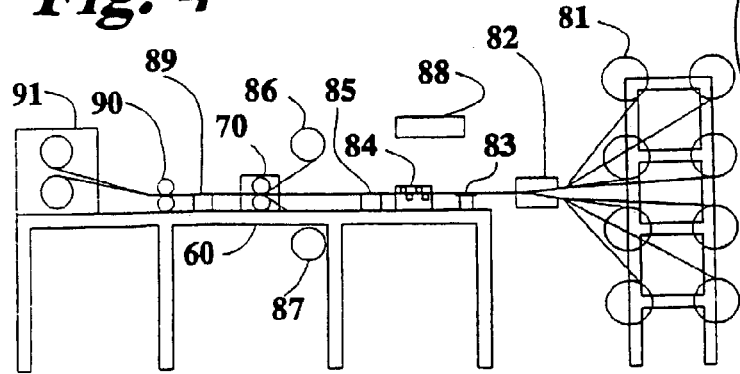
FIG. 4 is a side-elevation view of the assembly machinery and process of the present invention.

Turning to FIG. 4, the overall method of assembly of the flat cable 10 may be understood. The operation starts on the right side where multiple conductor reels 81 are mounted. In one embodiment, copper is used as conductors and these copper reels are purchased from Torpedo Wire Company (Pittsfield, Pa.). The conductors are pulled off of the conductor reels 81 and fed through the wiping area 82 in order to bring the conductors to the same plane and to clean the metallic conductors and remove any residue which might reduce conductivity. The conductors are then fed through the wire separation module 83. The conductor wires are then fed through the conductor straightening module 84 which is a series of grooved rollers that align the conductors. The conductors are then aligned in their final orientation by the conductor guide 85. The conductor guide 85 includes grooves which are spaced corresponding to the grooves 72 of the rotary anvil 70. Because the present method does not use adhesives and such liquid adhesives are not present on the insulator layers, the conductors remain positioned on the insulator layers according to the conductor guide 85. Further, the grooves 72 on the rotary anvil 70 also act to maintain the spacing of the conductors 40. The upper insulator reel 86 and lower insulator reel 87 include tension control means and are fed along with the conductor wires between the rotary horn 60 and the rotary anvil 70. The rotary anvil 70 includes guides along its edges in order to align the upper and lower insulator materials and the array of conductor wires. In a preferred embodiment, the upper and lower insulator materials are a clear polyester purchased from Plastic Suppliers, Inc. (Chicago Heights, Ill.).

The rotary horn 60 is controlled by the sonic controller and power supply 88. In one embodiment, the power supply is an Amtech 920 MA advanced high frequency constant amplitude power supply providing a 20 KHz at 2,000 watts (Amtech, Inc., Milford, Conn.). In a preferred embodiment, the controller includes a speed control in order to increase and decrease the speed of the assembly process. The power supply would also include an encoder in order to reduce the power when the process is slowed. When the various reels feeding the process need to be exchanged, it is desirable to slow down the process so that the reels may be changed more easily. The encoder and speed control features are coordinated in order to allow for this process. In an alternate embodiment, the controller will include a continuous mode adjustment which allows for the bonding to occur in a continuous mode or a noncontinuous mode and set the intervals at which the bonding will occur. As discussed above, it may be desirable to provide for nonbonded areas at the ends of the desired lengths of the flat cable where it will be separated. The continuous mode feature will provide for the "off" function of the ultrasonic welding for a preprogrammed amount of time so that a specific distance of the flat cable may have a nonbonded area and the automatic switching of the ultrasonic bonding back to an "on" position in which the continuous bonding is resumed. The controller in a preferred embodiment also includes an amplitude adjustment in order to vary the amplitude in order to control the bonding quality of the rotary horn. In a further alternative method of forming flat cable, insulator layers having windows at predetermined intervals may provide pre-stripped areas in which the conductors are exposed even during bonding.

Adjacent the rotary horn 60 is a cooling mechanism in order to cool the weld surface 65 of the horn 60. Also adjacent the bonding area may be a means of testing the presence and quality of the bond at the seams 50. In a preferred embodiment, a vision system may be used to test the seams 50. As the polyester used as insulators in the preferred embodiment is clear and the rotary horn includes a pattern, the bonded seams are not clear. Thus, a vision system may be programmed to test the clarity of the patterned bonded seams 50 of the successfully welded flat cable 10. If the cable is not bonded, the seams will remain clear and light will pass through the seam 50 without distortion and the bond testing means may be programmed to shut down the assembly process. Such a system may also be programmed to test and record the bonded and nonbonded areas as discussed above in an alternate embodiment.

The bonded flat cable is then pulled through cable slitter 89 in order to split the full widths of the cable into the desired widths of the subgroups of usable flat cable. As discussed above, in a preferred embodiment, the flat ribbon cable is bonded in three inch wide segments and then separated into six, half inch wide cables having six conductors each. The individually spliced flat cables then move through puller rollers 90. The puller rollers 90 pull the insulator layers and the conductor wires through the entire assembly process. Finally, the individual flat cables are received by take-up reels 91. The reels with the flat ribbon cable may then be transported to the specific areas where the flat ribbon cable 10 is to be used and the flat ribbon cable 10 would be cut to the desired lengths and have the ends processed in order to expose the conductors for attachment to a component such as a clockspring. In an alternate embodiment, the assembly process may have incorporated into it the cutting of the flat cable to the desired length and the process for exposing the conductors.

The stripping process may include the insertion of the end of the flat cable between a rotary grinding machine in order grind off the upper and lower insulator layers to leave the conductors exposed. The excess area beyond the exposed conductors may then be trimmed so that bare exposed conductors protrude from the end of the flat cable so that they may be mounted to a component such as an electrical connector and soldered thereto. In an alternate method of stripping the cable ends, a plurality of spaced, adjacent knife blades or punches may penetrate the insulator layers and pull the insulator layer from between and off of the conductors. The present invention provides for the flat cable having the conductors mounted between the insulator layers but not bonded to the insulator layers which provides for an easier stripping process. Because the conductors are not bonded to the insulator layers, the layers of insulation may more easily be stripped and removed from the surface of the conductors. Therefore, after the stripping process, the flat cable is left having protruding conductors without any adhesive residue. Further, in a preferred embodiment, the stripped conductors do not have any insulator residue either. Thus, it can be understood that the present invention provides for a flat cable having exposed conductors which do not have any residue which may inhibit the conductivity of the conductors and provide for a clean surface for the attachment of the conductors to a metallic surface and to allow for a successful soldering process where desired.

Furthermore, since the flat cable 10 does not use an adhesive to bond the upper layer 20 to the lower layer 30, the flat cable 10 is lighter in weight than is a flat cable made using adhesives to bond the insulating layers and conductors together. Testing has shown that when a flat cable having seven conductors, each conductor having a cross-section of 0.007 inches by 0.040 inches, was made having insulating layers of polyester each 0.0003 inches thick. The resulting flat cable weighed 43.5 grams for a ten foot length and the a flat cable made with the same insulating materials and conductors and using an adhesive weighed 48.9 grams for a ten foot length. Thus, the sonically welded flat cable weighed 5.4 grams less for a ten foot length as compared to the flat cable made using adhesive material. Therefore, for a seven conductor flat cable having polyester insulating layers the flat cable has a per unit length linear density of 4.35 grams/foot. The lower weight of the flat cable 10 generally tends to increase the natural frequency of the flat cable 10. Thus, when the flat cable 10 is installed in a device such as a clockspring, the flat cable 10 is not as susceptible to low frequency vibrational energy often experienced in clocksprings. Therefore, the device which uses the flat cable 10 will tend to be more quiet than a device which does not use flat cable 10.

Figure 5:
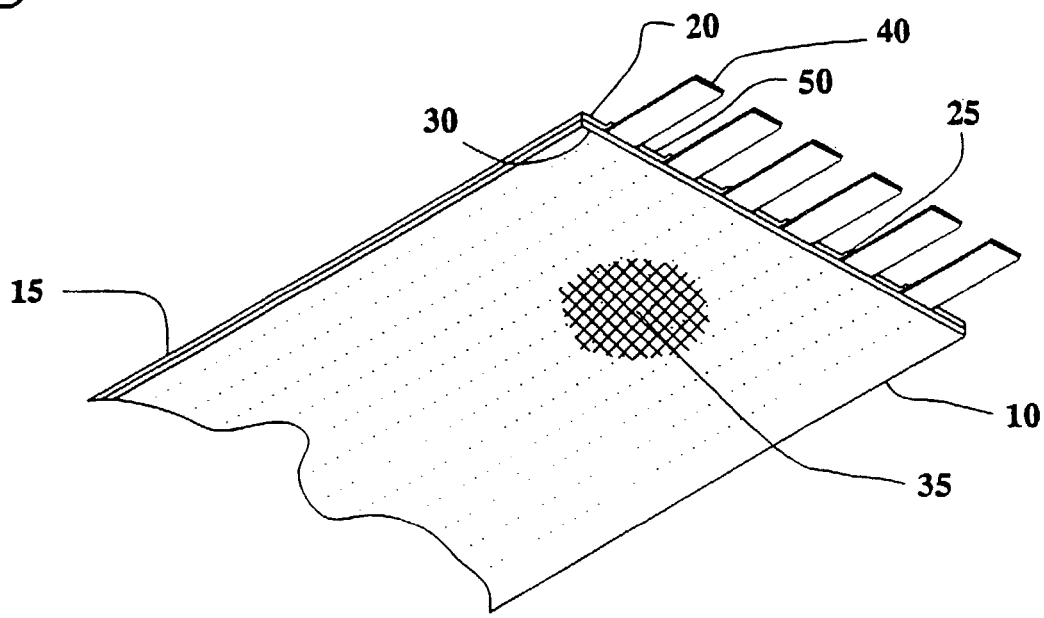
FIG. 5 is a perspective view of an alternate embodiment of the flat cable of the present invention showing the flat electrical cable after the end portion has been stripped to expose the conductors.

FIG. 5 is an alternate embodiment of the present invention showing the flat electrical cable 10 after the end portion has been stripped to expose the conductors 40. The flat cable 10 shown in FIG. 1 discloses the cable 10 in its condition after the bonding procedure discussed above. The cable 10 after the bonding procedure has the conductors enclosed within the upper and lower insulator layers 20, 30. In order to use the flat cable 10 and enable it to be attached to a component, the conductors 40 must be exposed. As discussed above, the conductors may be exposed by stripping the cable to remove the upper and lower insulator layers at an end portion of the cable. As discussed above, procedures such as grinding or cutting the insulator layers with a knife may be used, in addition to the above procedure providing for nonbonded areas. FIG. 5 shows the flat cable 10 after a stripping procedure has been applied to the cable having the array of conductors 40 exposed at the end portion. The conductors 40 protrude from between the upper and lower layers 20, 30 of the insulator and are surrounded on the upper side of the conductor 40 by the rib 25 of the upper layer 20 and having seams 50 on each side of the conductor 40. According to the advantages disclosed in the above invention, the conductors 40 do not have any adhesive residue thereon. After stripping of the end of the cable 10, no further procedure such as a cleaning of the conductors is necessary. Due to the bonding method discussed above, without use of adhesives, the conductors are clean and do not have residue which inhibits the conductivity of the metallic material. Following the stripping procedure and the exposure of the conductors 40 as shown in FIG. 5, the flat cable may then be attached to a component by soldering the array of conductors to a connector or inserting the conductors into an electrical connector. Thus, it may be understood according to the above description that the present invention provides for a cable 10 which may be manufactured quickly and easily and provide for a cost savings as well as providing for a finished cable which may be more easily stripped and attached to a component. As an example, the component may be an electrical connector mounted to a housing of a clockspring.

Figure 7:
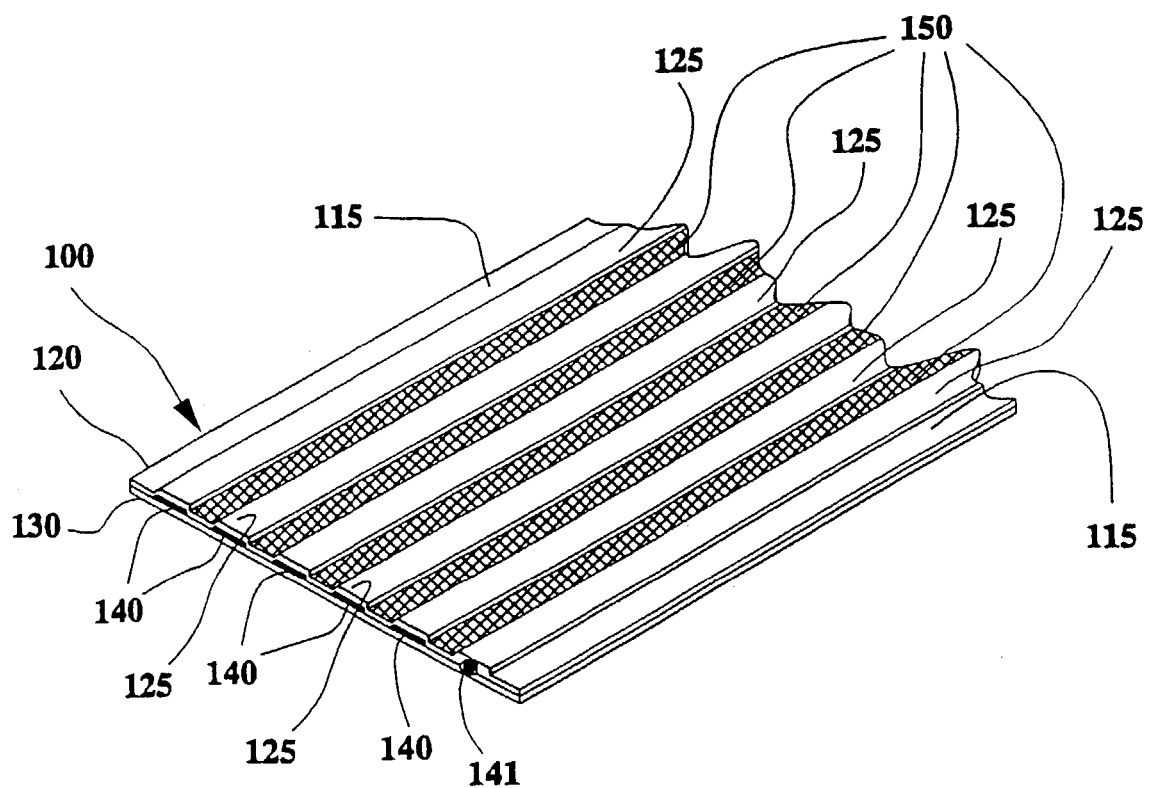
FIG. 7 is a perspective view of an alternate embodiment of the flat cable of the invention which was formed with the use of the modular rotary anvil.

In another embodiment, a perspective view of a preferred knurled flat cable 100 is shown in FIG. 7. The knurled flat cable 100 of FIG. 7 is similar to the flat cable 10 of the embodiment discussed above, the differences between the two flat cables are discussed below. The upper layer 120 is bonded to the lower layer 130 preferably by ultrasonic welding using the plunging mode. The plunging direction 167 is shown in FIG. 6. FIG. 6 is a view of the horn 65 and anvil 70 assembly of FIG. 2 where the rotary horn 65 operates in the plunge mode and the anvil is a modular rotary anvil 70a. The modular rotary anvil 70a is used to produce the knurled flat cable 100, where the modular rotary anvil 70a has knurled protrusion 74a, smooth broad protrusions 75, and smooth broad edge protrusions 75a. The knurled protrusions 74a form the knurled surface texture pattern on the knurled seams 150 of the knurled flat cable 100. The smooth broad protrusions 75 and 75a form the smooth continuous edge seams 115. The grooves 72 of the modular rotary anvil 70a form the raised surfaces or ribs 125. Conductors 140 comprise an intermediate layer between the upper layer 120 and the lower layer 130. An optical fiber 141 having at least one buffer coating is also shown in FIG. 7 in place of one of the conductors 140, as another embodiment of the invention. However, all of the conductors 140 could be replaced with fiber optic cables 141.

Experimental testing has shown that use of the plunge mode provides the most durable manufacturing method. Use of flat cable has shown that when seams between adjacent conductors have a knurled surface texture pattern 150 and the continuous edge seams 115 have a smooth continuous surface texture pattern such a flat cable is quiet in operation and provides for low torque when installed in a clockspring. The knurled center seams provide a low amount of surface area contact when the tape contacts itself, thus reducing friction and hence torque, when in a clockspring the flat cable is coiled up around itself. The smooth edge seam of the flat cable provides a smooth contacting surface between the flat cable and the interior surfaces of the clockspring housing and parts therein such as damping material. Other embodiments were tested. No other form of flat cable performed as well. One test was conducted on a flat cable where all of the seams were knurled. Another test was conducted on a flat cable where all of the seams were smooth and continuous. Further testing compared flat cable bonded by the shear mode to flat cable bonded by the plunge mode of ultrasonic welding. Such durability is required when the knurled flat cable 100 is used in a clockspring. Flat cable used in a clockspring is coiled and held within the clockspring housing where the flat cable is repeatedly partially uncoiled and recoiled. However, since the flat cable is coiled, the flat cable must be flexible. A smooth edge seam is determined to be smooth relative to the knurled seams located between adjacent conductors. As such, the smooth edge seams have a surface roughness which is less than the surface roughness of the knurled seams located between adjacent conductors.

Figures 8A, 8B:
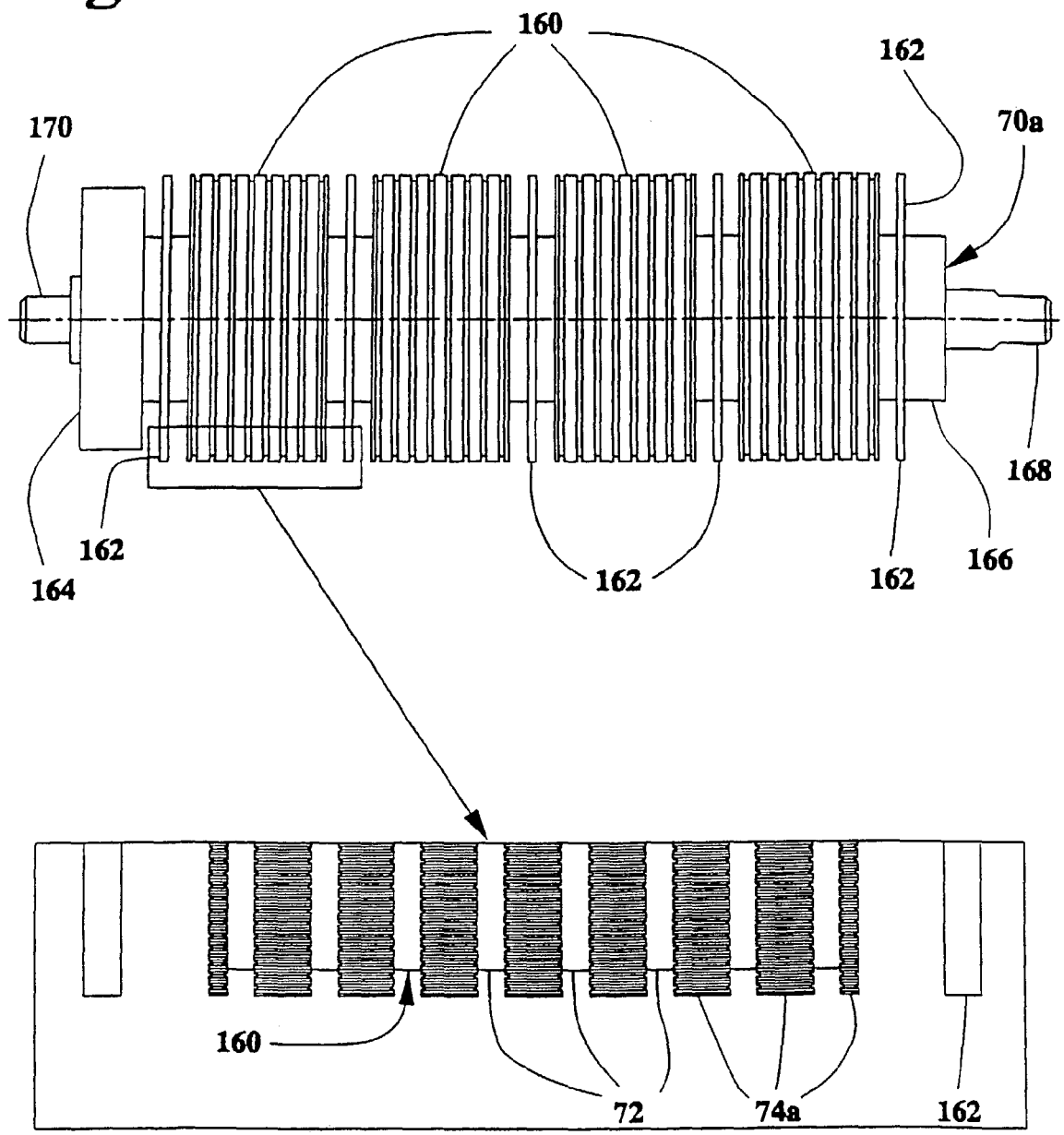
FIG. 8A is a front view of one embodiment of the modular rotary anvil.
FIG. 8B is an expanded detailed view of FIG. 8A.
Figures 9A, 9B:
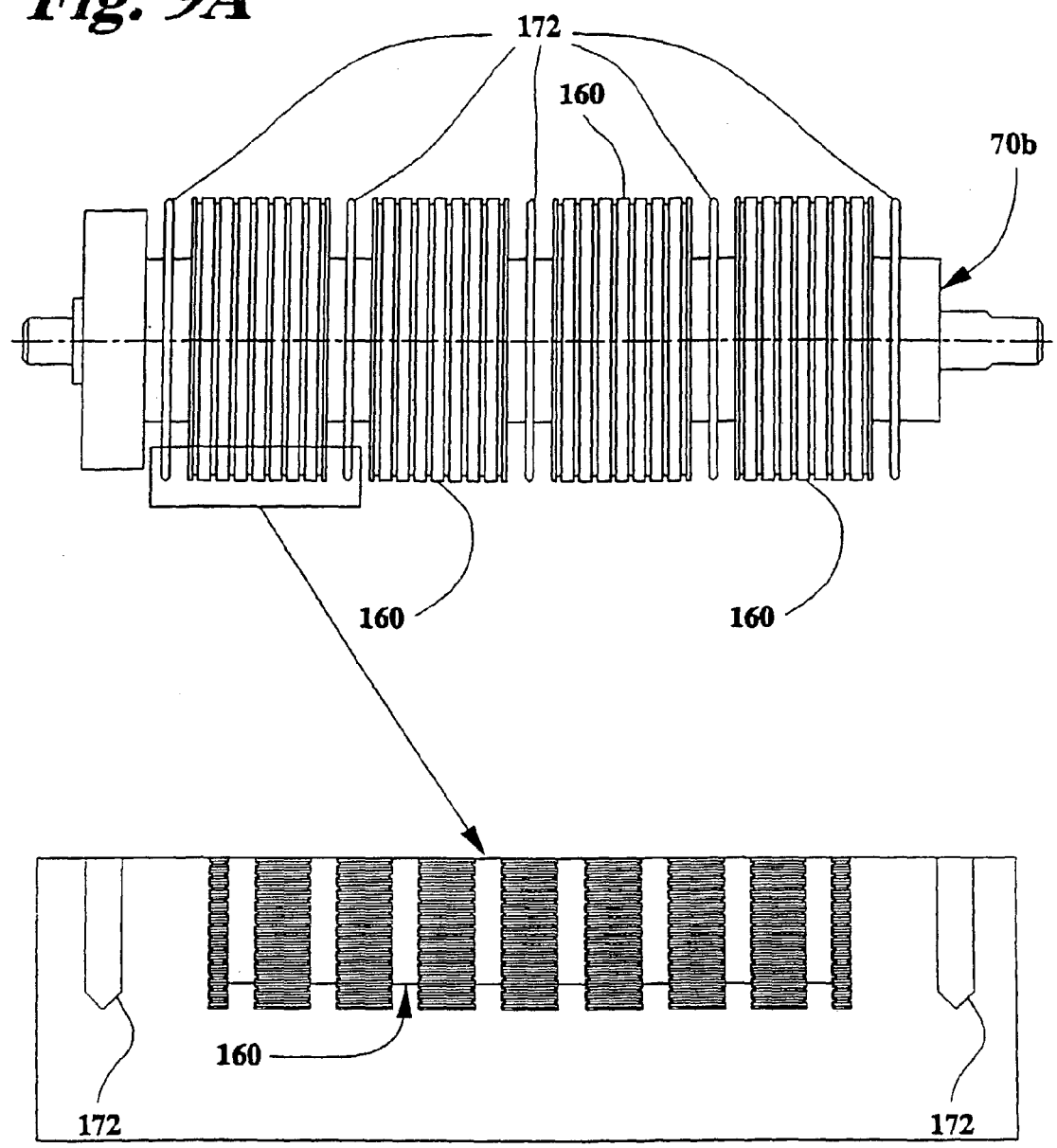
FIG. 9A is a front view of another embodiment of the modular rotary anvil.
FIG. 9B is an expanded detailed view of FIG. 9A.
Figure 14:
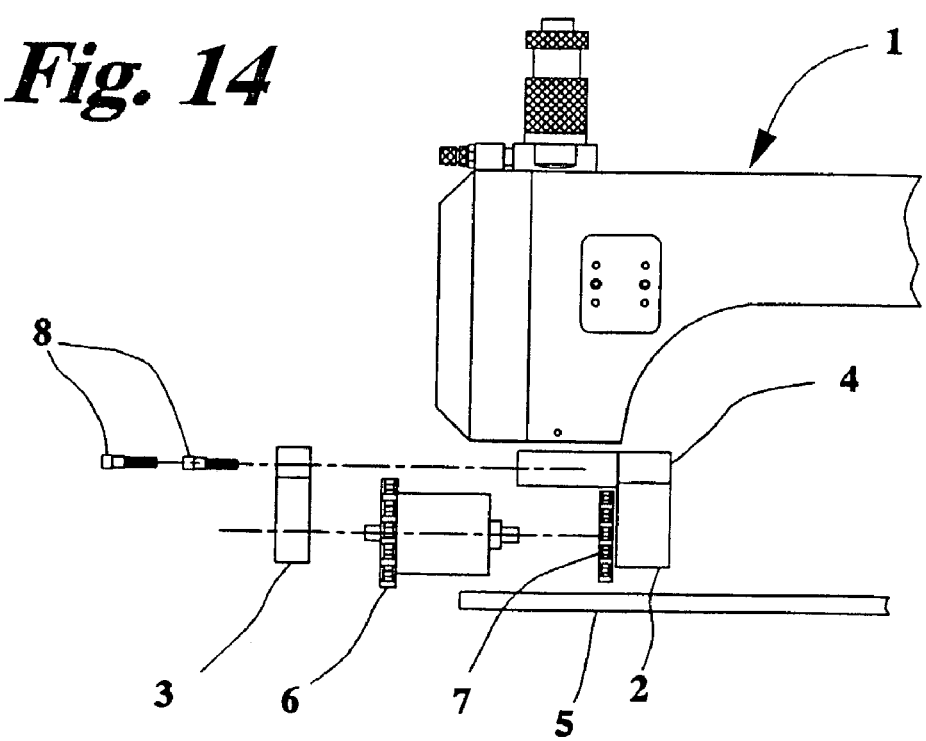
FIG. 14 is an exploded side view of a related ultrasonic welding machine.
Figure 15:
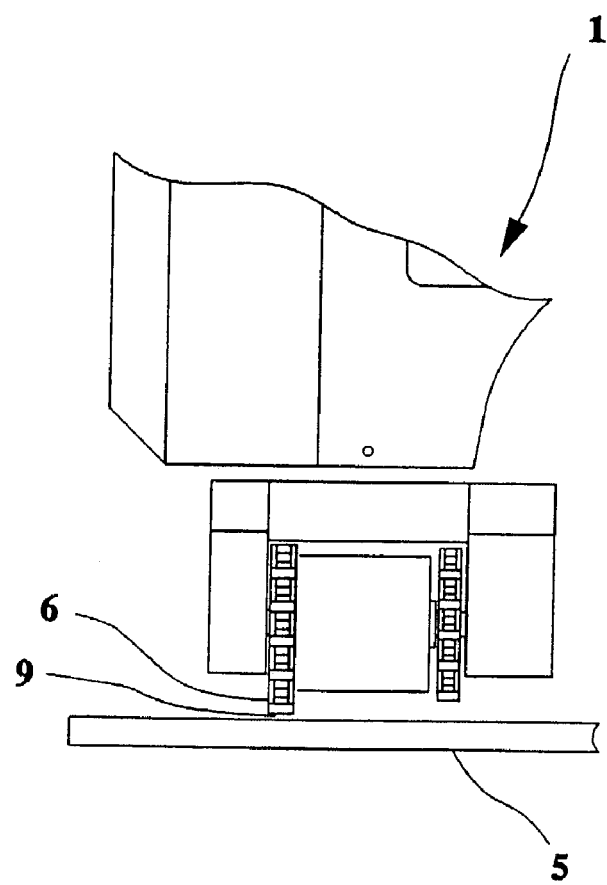
FIG. 15 is a side view of an assembled, related, ultrasonic welding machine of FIG. 14.

In a preferred embodiment the knurled flat cable 100 is made with the modular rotary anvil 70a as shown in FIG. 6. The anvil 70a is called a modular rotary anvil since it is formed of discrete modular segments, sections, or inserts. FIGS. 8A and 9A display side views of two different forms of the modular rotary anvil. FIG. 8A shows an assembly of knurled inserts 160, broad protrusion inserts 162, a large bracket insert 164, a small bracket insert 166, a first end segment 168, and a second end segment 170 which form the modular rotary anvil 70a. FIGS. 6 and 8B shows the knurled insert 160 having recesses 72 and knurled protrusions 74a. FIGS. 10A through 13B display some of the various individual inserts.

FIG. 10A is a side view of the large bracket insert 164, and FIG. 10B is a front view of the large bracket insert 164. FIG. 11A is a side view of the small bracket insert 166, and FIG. 11B is a front view of the small bracket insert. FIG. 12A is a side view of the knurled insert 160, and FIG. 12B is a front view of the knurled insert 160. FIG. 8B shows details of the knurled insert 160. FIG. 13A is a side view of the broad protrusion insert 162, and FIG. 13B is a front view of the broad protrusion insert 162. The assembly of inserts and segments are held together with socket head cap screws. The socket head cap screws are countersunk into one of the large bracket insert 164 and the small bracket insert 166 and the socket head cap screws are threaded into one of the other of the large bracket insert 164 and the small bracket insert 166. The first end segment 168 is attached to the small bracket insert 166 with socket head cap screws and the second end segment 170 is attached to the large bracket insert 164 with socket head cap screws. Alternatively, the assembly of inserts and segments are held together on a common shaft and secured with a nut and lock washer. The modular rotary anvil 70a can then be mounted on the ultrasonic welding machine as would any conventional rotary anvil.

The modular rotary anvil 70a can be used to make flat cable of many different dimensions and configurations. As described above, in regard to the flat cable 10, a different rotary anvil 70 was required if different seam width dimensions were necessary. Thus, a manufacturer of flat cable would be required to maintain a large inventory of rotary anvils. Such an inventory is expensive to produce and maintain. Furthermore, such an inventory relates directly to the cost of the flat cable produced. A further drawback to the rotary anvil concept is that the lag time between conception of a unique rotary anvil design and the finished manufactured rotary anvil is a relatively long period of time.

Applicant's modular rotary anvil 70a eliminates the need for a large inventory of rotary anvils. Instead, now, a manufacturer need only keep an inventory of different modular segments, sections, or inserts. The inserts can be built up or assembled in different ways to make a modular rotary anvil, where the modular rotary anvil produces a variety of flat cable designs. Such a concept supports flexible manufacturing needs, where the manufacture of different flat cable can be supported in a short amount of time. Thus, meeting the needs of the market. Furthermore, the invention of the modular rotary anvil results in flat cable which costs less to produce as compared to the prior art.

FIG. 9A is a side view of another modular rotary anvil 70b which has cutting inserts 172 interspersed between knurled inserts 160. FIG. 9B is a detailed view of a portion of FIG. 9A showing the cutting inserts 172. The cutting insert 172 attach to the modular rotary anvil 70b the same way as did the broad protrusion insert 162 of the modular rotary anvil 70a. In the embodiments discussed above the plurality of flat cables produced by a single rotary anvil were separated from each other by the cable splitter 89 shown in FIG. 4. The cutting insert 172 eliminates the need for the cable splitter 89; thus, reducing the number of steps need to produce the flat cable. The cutting insert 172 achieves this result by being able to ultrasonically bond the upper and lower layers together to form a seam, while substantially simultaneously the cutting insert 172 cuts the flat cable of the just bonded seam. Other portions of the modular rotary anvil 70b are the same as the modular rotary anvil 70a described above.

Figure 16:
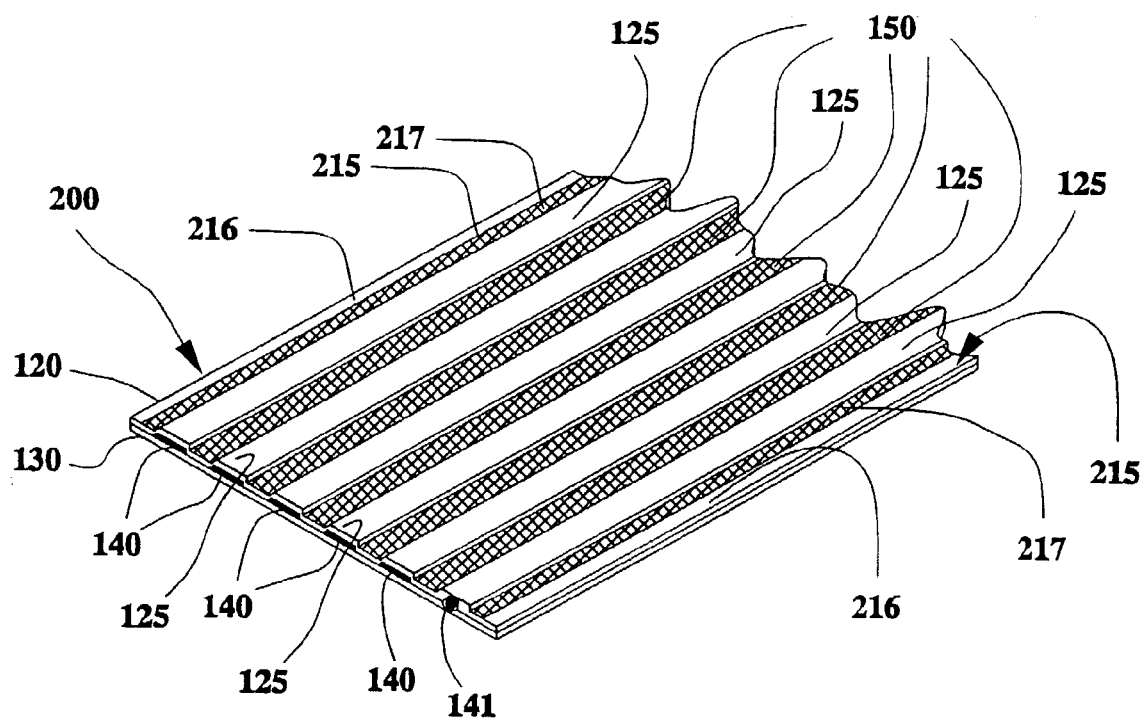
FIG. 16 is a perspective view of another alternate embodiment of the flat cable of the invention which was formed with the use of the modular rotary anvil.

In still yet another embodiment of the invention, a perspective view of a preferred edge seam semi-knurled flat cable 200 is shown in FIG. 16. The edge seam semi-knurled flat cable 200 of FIG. 16 is similar to the knurled flat cable 100 of the embodiment discussed above and shown in FIG. 7, the differences between the two flat cables are discussed below. The upper layer 120 is bonded to the lower layer 130 preferably by ultrasonic welding using the plunging mode. The operation of the plunge mode is similar to that described in regard to the flat cable 100. However, in this embodiment, the modular rotary anvil would not have a smooth broad edge protrusion 75a forming the smooth continuous edge seam 115. Instead, the protrusion of the rotary modular anvil (not shown) has half of its width knurled and the other half smooth. Such a protrusion of the rotary modular anvil forms a semi-knurled edge seam 215. The semi-knurled edge seam 215 includes a first zone 217 adjacent one of the conductors which is knurled and a second zone 216 which is smooth, as shown in FIG. 16.

The semi-knurled edge seam flat cable 200 has the advantage that when used in a clockspring, it is still quiet, due to the use of the smooth edge portion of the edge seam. However, this embodiment solves a problem by including the first zone 217 of the edge seam 215 which is knurled. The knurled seam requires less energy than the smooth continuous seam. Since the edge seam 215 includes a knurled zone, the edge seam 215 requires less energy to bond the edge seam 215. The energy savings is then directed towards the seams located between the conductors, so as to make those seams 150 more strong. Otherwise, to ensure a proper bond between the upper layer 120 and the lower layer 130 at the location of the seams positioned between the conductors, the speed at which the flat cable exits the manufacturing machinery must be decreased. So the semi-knurled edge seam 215 enables the flat cable 200 to exit the manufacturing machinery at a high rate of speed while still maintaining its structural integrity.

Figure 17:
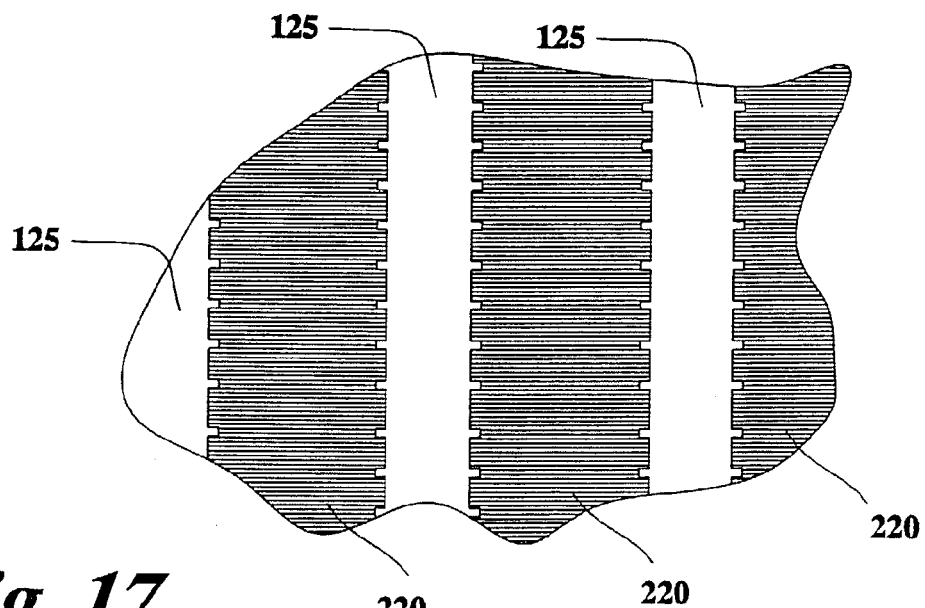
FIG. 17 is an expanded view of a portion of an alternate knurl pattern.

FIG. 17 is an expanded view of an alternative knurl or surface texture pattern as can be produced on flat cables 100 or 200. The raised surfaces or ribs 125 are smooth and the seam region 220, which corresponds to seams 150, can have a surface texture formed of a row of repeating parallel lines or linear segments, where the lines or linear segments are substantially perpendicular to a length dimension of the flat cable. Such a surface texture is easy to grasp, forms a strong bond, and is a relatively easy pattern to impart on the modular rotary anvil.

Figure 24:
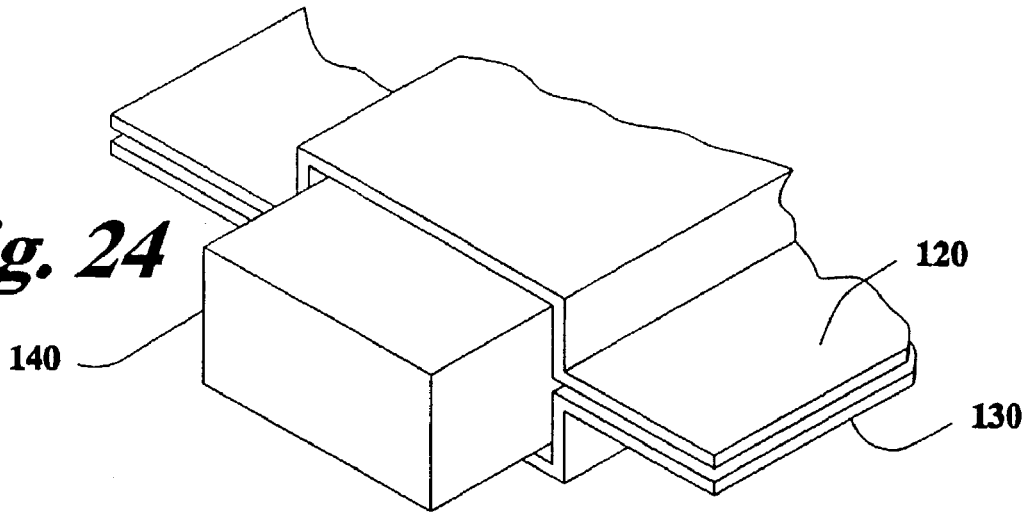
FIG. 24 is an exploded, perspective view of a single flat conductor assembled with upper and lower insulation layers.

FIGS. 18–23 show end views of alternative conductors or conductor groups. Alternative conductor configurations solve various problems experienced while using flat cable. A single conductor 140 is inexpensive to manufacture and assemble. Depending on the radius of curvature that the flat cable experiences, the conductor 140 may experience large bending stresses. As such, it is better to reduce the stresses by making the conductor smaller. Furthermore, a smaller conductor requires less force to bend the flat cable. Additionally, alternative conductor combinations make it possible to carry higher current loads for a short amount of time. FIG. 18 is an end view of a single conductor 140 having a width, w, and a thickness, t, as shown in the previous embodiments. FIG. 24 is an exploded, perspective view of the single flat conductor 140 assembled with an upper insulation layer 120 and a lower insulation layer 130. The upper and lower insulation layers 120, 130 are shown separated from each other for reasons of clarity. The single conductor shown is just one of many that would populate the flat ribbon cable.

Figure 25:
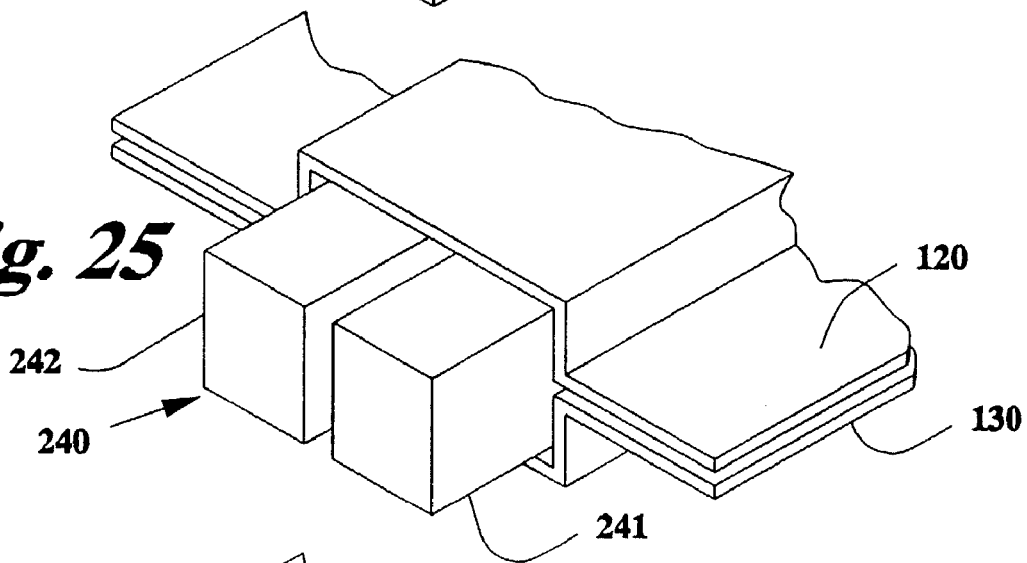
FIG. 25 is an exploded, perspective view of a dual tandem conductor group assembled with upper and lower insulation layers.

FIG. 19 is an end view of a dual or tandem conductor group 240, where each of the individual conductors 241, 242 are substantially identical to each other. In this embodiment, each of the conductors 242, 241 has a thickness, t, which is similar to that of the single conductor 140, and a width, w/2, which is substantially one-half of the width of the single conductor 140. Thus, the dual or tandem conductor group 240 fits within the pre-existing space of the single flat conductor 140. Therefore, the shape of the rotary modular anvil does not change. FIG. 25 is an exploded, perspective view of the dual or tandem conductor group 240 assembled with an upper insulation layer 120 and a lower insulation layer 130. The dual or tandem conductor group shown is just one of many that would populate the flat ribbon cable.

Figure 27:
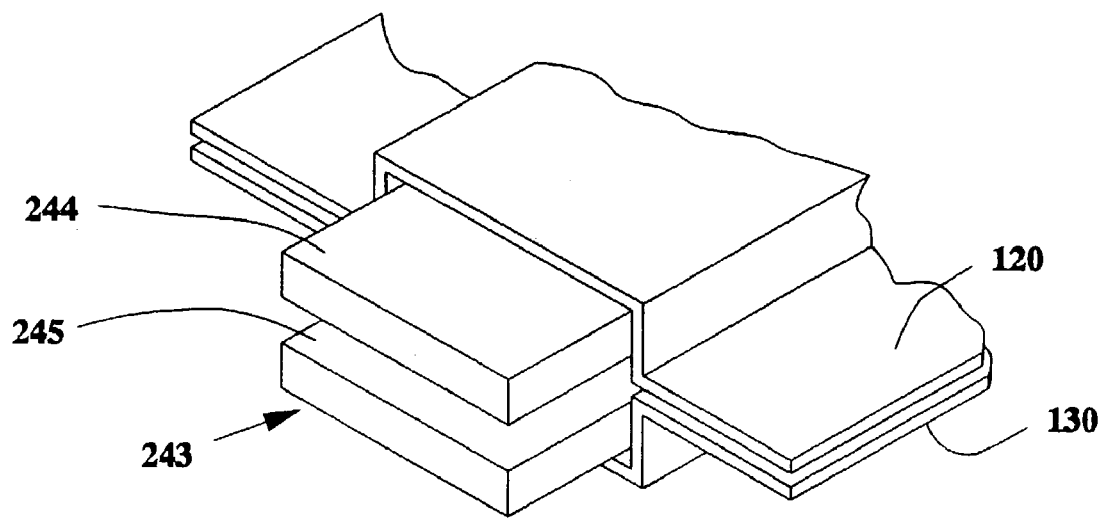
FIG. 27 is an exploded, perspective view of a dual stacked conductor group assembled with upper and lower insulation layers.

FIG. 20 is an end view of a dual stacked conductor group 243, where each of the individual conductors 244, 245 are substantially identical to each other. In this embodiment, each of the conductors 244, 245 has a thickness, t/2, which is one-half of the thickness of the single conductor 140, and has a width, w, which is similar to that of the single conductor 140. Thus, the dual stacked conductor group 243 fits within the pre-existing space of the single flat conductor 140. Therefore, the shape of the rotary modular anvil does not change. FIG. 27 is an exploded, perspective view of the dual stacked conductor group 243 assembled with an upper insulation layer 120 and a lower insulation layer 130. The dual stacked conductor group shown is just one of many that would populate the flat ribbon cable.

Figure 26:
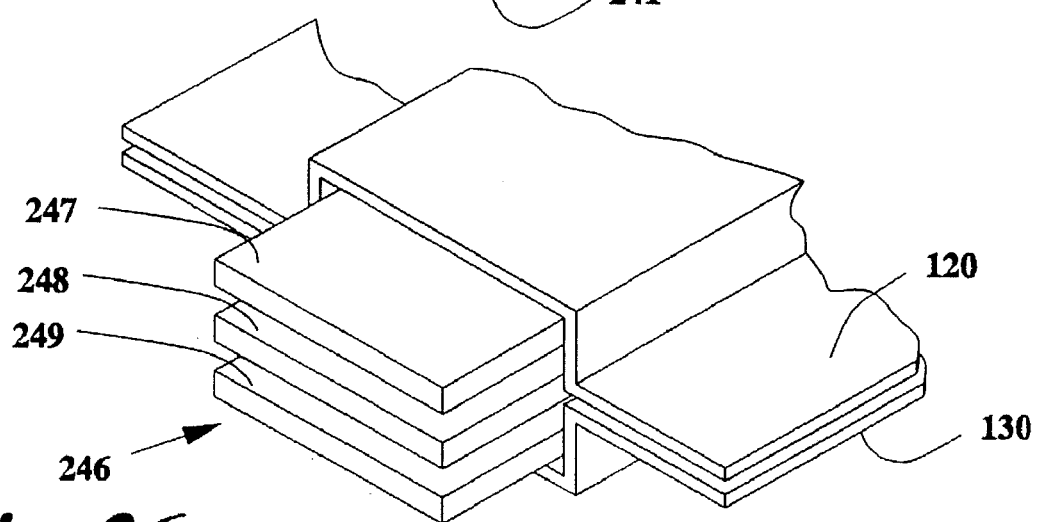
FIG. 26 is an exploded, perspective view of a triple stacked conductor group assembled with upper and lower insulation layers.

FIG. 21 is an end view of a triple stacked conductor group 246, where each of the individual conductors 247, 248, 249 are substantially identical to each other. In this embodiment, each individual conductor 247, 248, 249 has a thickness, t/3, which is substantially one-third of the thickness of the original conductor 140, and a width, w, which is similar to that of the original conductor 140. Thus, the triple stacked conductor group 246 fits within the pre-existing space of the single flat conductor 140. Therefore, the shape of the rotary modular anvil does not change. FIG. 26 is an exploded, perspective view of the triple stacked conductor group 246 assembled with an upper insulation layer 120 and a lower insulation layer 130. The triple stacked conductor group shown is just one of many that would populate the flat ribbon cable.

Figure 28:
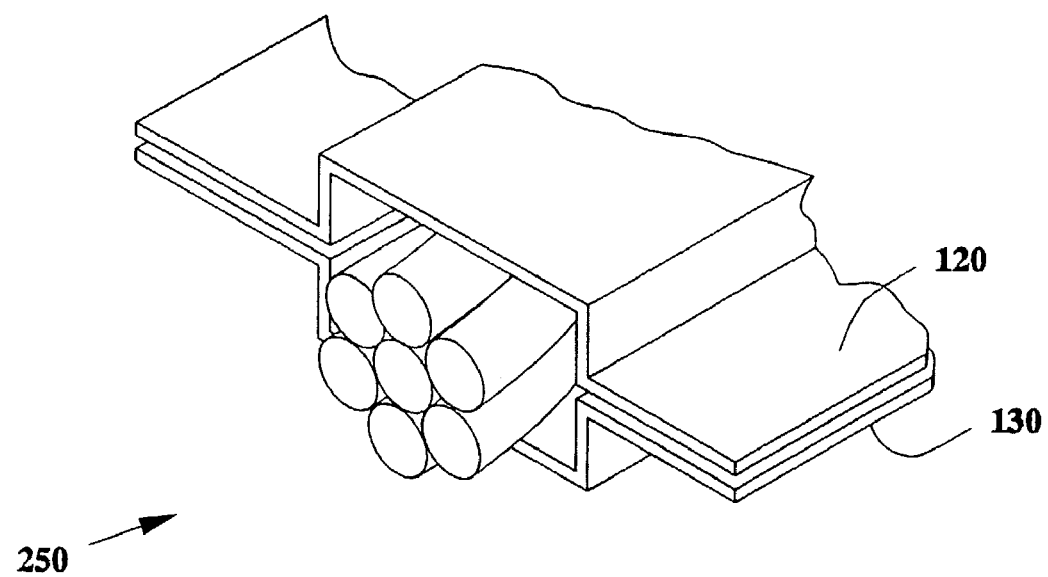
FIG. 28 is an exploded, perspective view of a wire rope conductor group assembled with upper and lower insulation layers.

FIG. 22 is an end view of a wire rope conductor group 250. FIG. 23 is an end view of a wire rope conductor 250 after the wire rope conductor 150 has been compressed. Seven individual wires are shown. Each wire is approximately 24 gauge. The compressed wire rope conductor 250 has a thickness, t, similar to that of the original conductor 140, and a width, w, similar to that of the original conductor 140. Thus, the wire rope conductor group 250 fits within the pre-existing space of the single flat conductor 140. Therefore, the shape of the rotary modular anvil does not change. FIG. 28 is an exploded, perspective view of the compressed wire rope conductor group 250 assembled with an upper insulation layer 120 and a lower insulation layer 130. The compressed wire rope conductor group shown is just one of many that would populate the flat ribbon cable.

Furthermore, a single flat ribbon cable can include conductors of various forms. As an example, a flat cable can have seven conductors. The first conductor can be a single flat conductor 140, the second conductor can be a dual or tandem conductor 240, the third conductor can be a dual stacked conductor 243, the fourth conductor can be a triple stack conductor 246, the fifth conductor can be a compressed wire rope conductor 250, the sixth conductor can be an optical fiber 141, and the seventh conductor can be a single flat conductor 140. Other combinations of conductors are possible and can be suited to the industrial requirements of the use of the device.

Other embodiments are also envisioned such as a clockspring containing flat cable, where the clockspring connects crash sensors to an airbag located in a harness-type seat belt. Such a clockspring would take-up the slack of the seat belt when the seat belt spooled and un-spooled. Non-automotive applications are also envisioned.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

What is claimed is:

1. A method of assembling a flat electrical cable comprising the steps of:

simultaneously feeding an upper and lower layer of insulating material and an intermediate layer of conductors between a horn and a modular rotary anvil;

ultrasonically bonding the upper and lower layers together along a seam substantially parallel and adjacent the conductors, and applying a textured pattern to the lower layer that extends flatly and continuously along substantially the entire outer surface of the lower layer providing a friction reducing surface on the lower layer to reduce friction between the lower layer and another surface.

2. The method of claim 1 wherein
the step of ultrasonically bonding includes the horn operating in a plunge mode.

3. The method of claim 1 wherein
the step of simultaneously feeding includes the modular rotary anvil having at least one segment having a series of grooves and protrusions corresponding to the arrangement of the conductors oriented between the insulator layers wherein the insulator layers are compressed between the protruding portion and a weld surface of the rotary horn in order to form the seams.

4. The method of claim 3 wherein
at least one of the protrusions of the modular rotary horn has a textured surface pattern.

5. The method of claim 4 wherein
the textured surface pattern is a knurled surface pattern.

6. The method of claim 3 wherein
at least one of the protrusions of the modular rotary anvil has a smooth surface pattern.

7. The method of claim 1, further comprising the steps of
cutting the flat cable into individual lengths and stripping ends of the flat cable.

8. The method of claim 7 wherein
the step of stripping includes the sub-steps of removing the upper and lower insulator layers so as to leave the conductors exposed and protruding beyond the end of the flat cable.

9. The method of claim 7 wherein
the step of stripping includes the sub-step of inserting the end of the flat cable into a rotary grinding machine to remove the upper and lower insulator layers to expose a width of the conductors, and removing the excess end portion of the cable to leave the protruding conductors.

10. The method of claim 1, further comprising the step of
testing the assembled flat cable for the presence of bonded seams.

11. The method of claim 1 wherein
the step of simultaneously feeding the intermediate layer of conductors includes at least one conductor which is a fiber optic cable.

12. The method of claim 1, further comprising the step of:
inserting the flat cable into a housing.

13. The method of claim 1, further comprising the steps of:
stripping a first end of the flat cable so as to expose the conductors, and further comprising the step of attaching an electrical connector to the first end of the flat cable, and wherein the electrical connector is mounted to the housing, and wherein the step of attaching immediately follows the step of stripping.

* * * * *